(12) United States Patent
Jungwirth (10) Patent No.: US 9,954,482 B2
(45) Date of Patent: Apr. 24, 2018

(54) RIGIDLY MOUNTED TRACKING SOLAR PANEL AND METHOD

(71) Applicant: THE BOEING COMPANY, Chicago, IL (US)

(72) Inventor: Douglas R. Jungwirth, Porter Ranch, CA (US)

(73) Assignee: THE BOEING COMPANY, Chicago, IL (US)

( * ) Notice: Subject to any disclaimer, the term of this patent is extended or adjusted under 35 U.S.C. 154(b) by 9 days.

(21) Appl. No.: 14/880,560

(22) Filed: Oct. 12, 2015

(65) Prior Publication Data
US 2017/0104444 A1    Apr. 13, 2017

(51) Int. Cl.
| H01L 31/042 | (2014.01) |
| H02N 6/00 | (2006.01) |
| H02S 20/32 | (2014.01) |
| H02S 40/22 | (2014.01) |
| H01L 31/048 | (2014.01) |
| H01L 31/054 | (2014.01) |
| F24J 2/08 | (2006.01) |
| F24J 2/04 | (2006.01) |

(52) U.S. Cl.
CPC ............ *H02S 20/32* (2014.12); *H01L 31/048* (2013.01); *H01L 31/0543* (2014.12); *H02S 40/22* (2014.12); *F24J 2/08* (2013.01); *F24J 2002/0416* (2013.01); *Y02E 10/52* (2013.01)

(58) Field of Classification Search
CPC ....... H02S 20/32; H02S 40/22; H01L 31/0543
See application file for complete search history.

(56) References Cited

U.S. PATENT DOCUMENTS

| 5,505,789 | A  | * | 4/1996  | Fraas ...................... F24J 2/085 |
|           |    |   |         | 136/246 |
| 5,707,458 | A  | * | 1/1998  | Nagashima ................ F24J 2/38 |
|           |    |   |         | 126/573 |
| 9,097,841 | B2 |   | 8/2015  | Fornari et al. |
| 2003/0201007 | A1 | * | 10/2003 | Fraas .................... H01L 31/042 |
|           |    |   |         | 136/246 |
| 2010/0163096 | A1 | * | 7/2010  | Palen .................... H01L 31/048 |
|           |    |   |         | 136/246 |
| 2014/0299175 | A1 |   | 10/2014 | Gilbert |

* cited by examiner

*Primary Examiner* — Angelo Trivisonno
(74) *Attorney, Agent, or Firm* — Coats & Bennett, PLLC

(57) ABSTRACT

A rigidly mountable solar panel includes lenses supported above a movable panel to focus sunlight onto photovoltaic material carried on the movable panel. Flexible supports space the movable panel at the focal points of the lenses, and a servo-mechanism enables movement of the movable panel to adjust position as the focal point moves with the sun. A light detector on the movable panel, sensing movement of the focal point signals the servo-mechanism to adjust the position of the movable panel automatically, thereby tracking the sun's movement. Concentrating sunlight on photovoltaic material selected to have higher conversion efficiency increases output. Segmenting the photovoltaic material so the output of the segments can be combined in a series-parallel relationship and using mirrors on the ends of the movable panel to reflect sunlight onto the segments allows electricity that is generated by the photovoltaic material to be more uniform during daylight.

15 Claims, 7 Drawing Sheets

RIGIDLY MOUNTED TRACKING SOLAR PANEL AND METHOD

TECHNOLOGICAL FIELD

The present disclosure relates generally to the solar panels. More specifically, the present disclosure relates to solar panels that track the movement of the sun.

BACKGROUND

Most solar panels that convert the sun's radiation into electric energy use fixed flat-panels of silicon. Silicon is the photovoltaic material of choice because its properties are well known and it is cheap, readily available in the quantities needed, durable and reliable. Silicon is also a single-junction photovoltaic material so it is not affected by changes in the spectral distribution; its output depends on the integrated power density within the limits of its absorption range. Flat panels of silicon are simple to make and install in an outdoor environment.

There are disadvantages to fixed, flat silicon solar panels. Silicon has a relatively low conversion efficiency, typically 18% to 20% and theoretically not to exceed 30%. Because of this relatively low conversion efficiency, bigger panels, more panels and a larger area for the panels are used to produce power than would be the case were the conversion efficiency higher. In the case of roof-mounted solar panels for home electricity generation, the amount of power used by a household is usually much more than can be generated by solar power from flat silicon panels given the size of the roof of a residence. In the case of power plants, land requirements for solar collectors quickly become the dominant cost. Finally, most solar panels are made overseas so supplies of new and replacement panels may be subject to international stability issues and currency fluctuations.

One way to increase the conversion efficiency of flat silicon panels is to have them track the sun. While solar panel tracking systems do improve efficiency, they also add to capital cost, operating costs, and maintenance costs. They also use electrical power to operate thereby offsetting their conversion efficiency gains. Furthermore, their tracking ability is compromised by wind and gravitational deflection.

The efficiency of solar panels may also be improved by different photovoltaic materials, although better photovoltaic materials are more expensive and not widely available.

Despite the challenges of solar electricity, a solar panel that would be capable of producing more electricity per square meter would be of significant advantage over current solar panels and useful in more numerous applications.

BRIEF SUMMARY

The present disclosure describes a solar panel that employs plural lenses rigidly mounted to a framework. Flexible supports depend from plural lenses and hold a movable panel in spaced relation to the plural lenses. The lenses focus the sunlight, as it moves with the moving sun, onto the movable panel and, in particular, onto photovoltaic material on the movable panel. The focusing of sunlight on photoelectric material enables higher conversion efficiencies at lower material cost. The array of lenses is oriented east-west and tilted to match the sun's tilt angle with respect to the earth. Tracking of the sun's movement through the seasons is thus reduced and can be further accommodated by moving the movable panel that holds the photovoltaic material. One lens of the plural lenses directs light onto a detector on the movable panel instead of onto photovoltaic material. The detector is electrically connected to a servo-mechanism that responds to signals from the detector. Those signals communicate position information to the servo-mechanism. That position information indicates the location of the focal point on the detector. When movement of the sun moves the focal point on the detector to a different location on the detector, that movement causes the servo-mechanism to adjust the position of the movable panel to restore the position of the focal point to its initial location on the detector.

A feature of the disclosure is the use of a plurality of lenses, which may be cylindrically or spherically curved, to focus sunlight on photovoltaic material arranged on a panel.

Another feature of the disclosure is the use of flexible supports for holding the movable panel in spaced relation with respect to the lenses, and which supports can flex in response to the operation of the servo-mechanism in adjusting the movable panel to maintain the focal point of the lens on the photovoltaic material in response to the movement of sunlight.

Another feature of the disclosure is that the lens may be a spherical lens or a cylindrical lens, and an array of lenses may be a row of long cylindrical lenses or a two dimensional array of spherical lenses.

Another feature of the solar panel is the use of mirrors at the ends of the movable panel to reflect light striking an end wall of the movable panel onto the photovoltaic material adjacent to the end wall so as to capture an addition amount of light energy.

A feature of the solar panel is that the photovoltaic materials may be divided into a plurality of segments so that the quantity of electricity generated in one segment can be combined with the quantity of electricity generated in another segments in a manner that produces a more constant output through the day. For example, the quantity of electricity of the outermost segments may be combined in parallel and the quantity of electricity of all the pairs of segments may be combined in series.

Still another feature of the present disclosure is that a solar panel with a plurality of cylindrical lenses can be oriented with the long axis of a lens parallel to the daily path of the sun and the solar panel is tilted to match the tilt angle of the sun with respect to the earth's axis to minimize the movement for tracking the sun.

A feature of the solar panel is that the servo-mechanism is configured to move the movable panel with respect to the array of cylindrical lenses while they are held at a fixed length with respect to the panel so sunlight is focused on the photovoltaic material.

Other features and their advantages will be apparent to those skilled in the art of solar panels from a careful reading of the Detailed Description accompanied by the following drawings.

BRIEF DESCRIPTION OF THE DRAWINGS

Having thus described variations of the disclosure in general terms, reference will now be made to the accompanying drawings, which are not necessarily drawn to scale, and wherein:

DETAILED DESCRIPTION

The solar panel as disclosed may be in the form of a solar panel 10 that may be rigidly mounted to a solid surface with the proper orientation and tilt, and commence to automatically track the sun's movement and to optimize the collection efficiency of the photovoltaic material being used. Solar panel 10 may be thin: 1.5 cm-2.5 cm thick, for example, and scalable. A solar panel 10 may be a square meter, for example, and light-weight. It may use less photovoltaic material so using higher efficiency concentrator photocell materials becomes cost-effective. Its lenses can be made of any optical glass or optical plastic and may be configured as Fresnel lenses.

Figure 1:
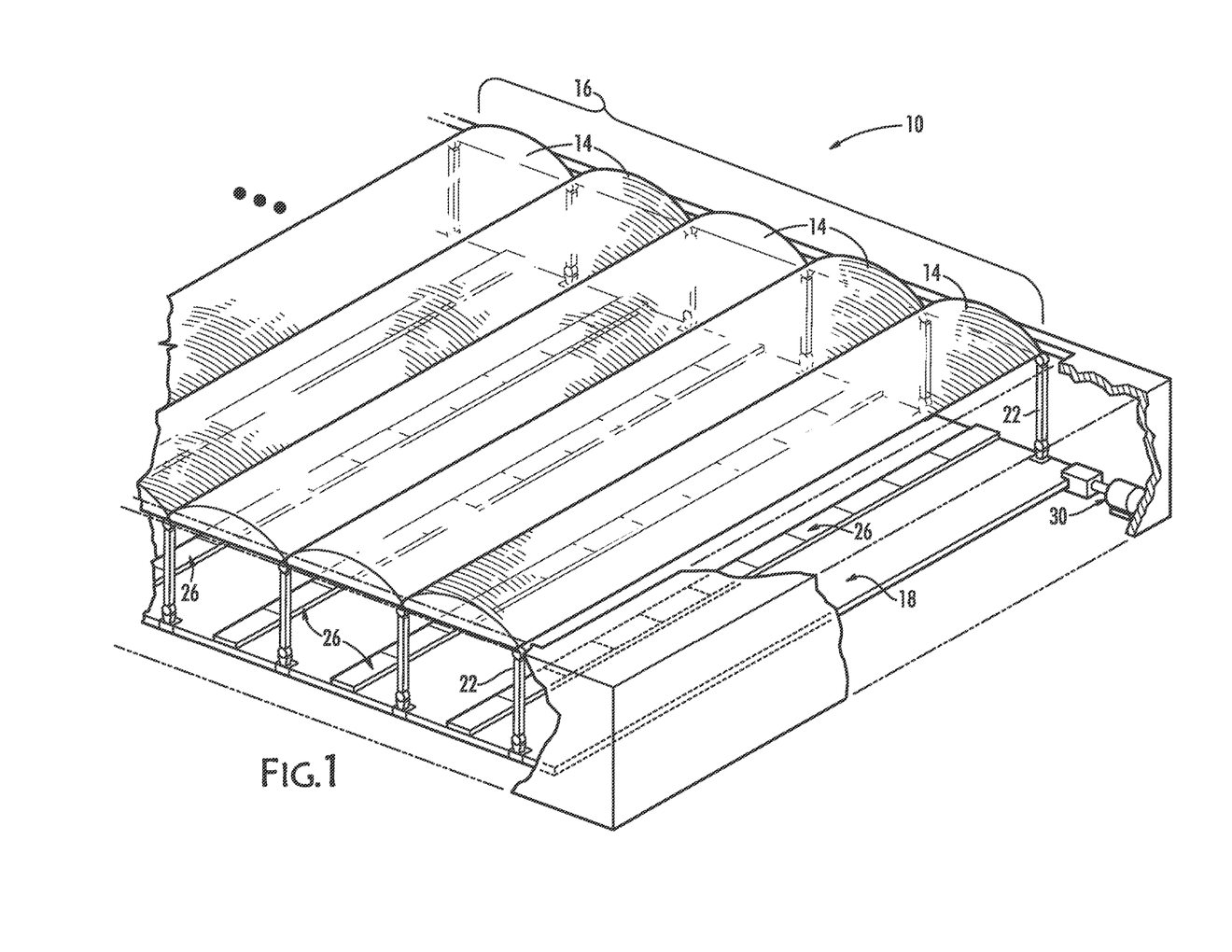
FIG. 1 is a top perspective view of a solar panel 10 showing lenses 14 above a movable panel 18 that carries photovoltaic material 26, the lenses 14 being connected to movable panel 18 by flexible supports 22, and the movable panel 18 being movable by a servo-mechanism 30, according to an aspect of the disclosure.

FIG. 1 is a perspective view of a solar panel 10 comprising plural lenses 14, arranged in an array 16 and supporting a movable panel 18 by flexible supports 22. Lens 14 in array 16 is shown as cylindrical in this illustration and has an axis of symmetry parallel with the long dimension of lens 14. In use, panel 18 would be oriented with the axis of symmetry of lens 14 running east and west, and would be tilted at the tilt angle of the sun which is the angle between the earth's rotational axis and its orbital axis, which is about 23.4 degrees.

At the focal point of a cylindrical lens 14 on panel 18 is photovoltaic material 26. Because lens 14 is able, by virtue of its geometry and its distance from movable panel 18 to the sun, to focus the parallel rays of sunlight into a narrow beam, the area of photovoltaic material 26 may be smaller and therefore the quantity of photovoltaic material may be less. Accordingly, photovoltaic material of higher efficiency than silicon may be used despite higher cost per unit area.

Lens 14 may be spherical, and array 16 would then be made of spherical lenses, such as an array of rows and columns or a close-packed hexagonal array. A spherical lens 14 focuses light onto a small circle on photovoltaic material 26 on movable panel 18.

Flexible supports 22 are shown in FIG. 1 as suspended from the ends of lens 14. Flexible supports 22 may alternatively be walls between lenses 14. A servo-mechanism 30 or other mechanical device capable of causing lateral movement is attached to movable panel 18 and configured to cause panel 18 to move laterally. Flexible supports 22 serve to keep the focal distance between lens 14 and movable panel 18 constant Servo-motor 30 moves movable panel 18 laterally with respect to lens 14.

The ability of flexible supports 22 of solar panel 10 to enable movable panel 18 to be moved laterally allows the focal point of lens 14 to remain centered on photovoltaic material 26 despite movement of the sun. Servo-motor 30 moves movable panel 18 in tracking the sun. The amount of movement required is small. Lens 14 is placed so that its long dimension is parallel to the east-west path of the sun and tilted to match the sun's tilt axis with respect to the earth. Accordingly, most of the daily movement of the sun is accommodated by the initial positioning of solar panel 10. The position of the sun will change from being directly overhead at noon based on latitude. Accordingly, a residual amount of solar tracking is required.

Figure 2:
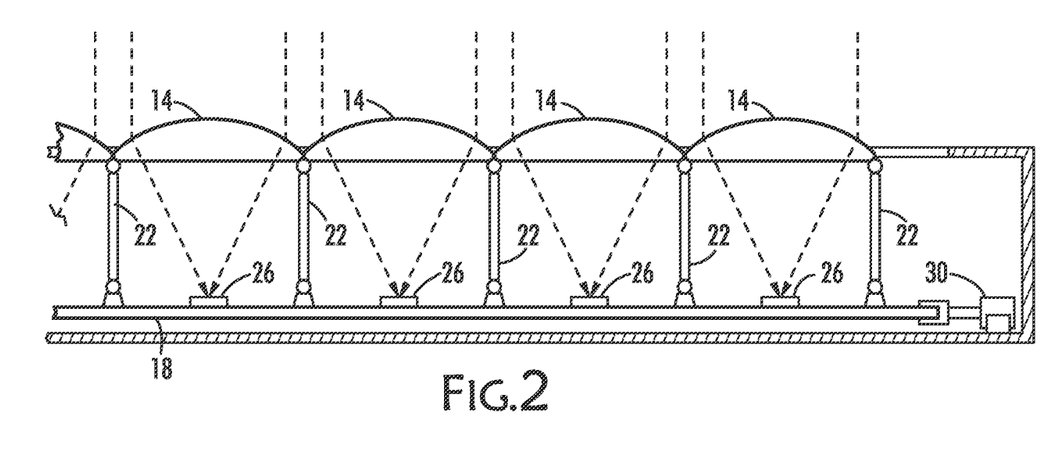
FIG. 2 is an end view of the solar panel 10 of FIG. 1, according to an aspect of the disclosure.
Figure 3:
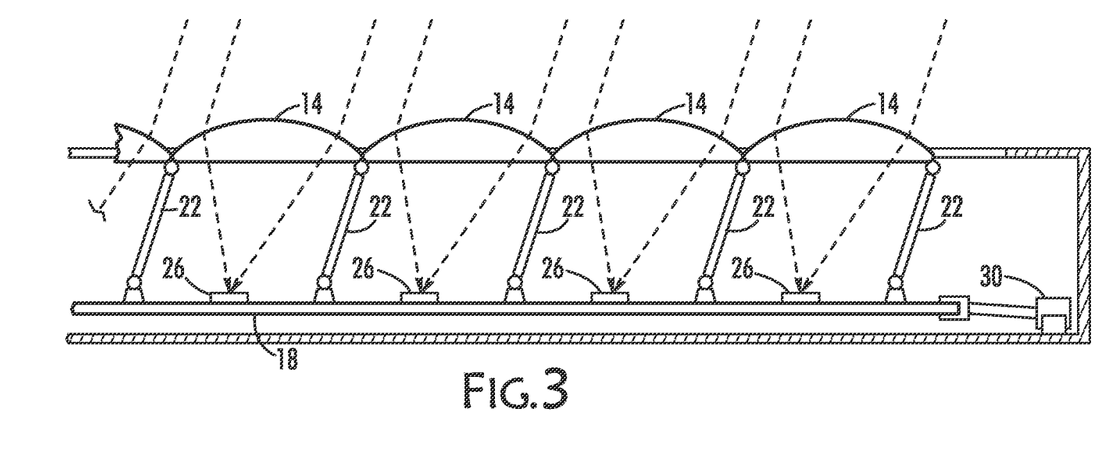
FIG. 3 is an end view of the solar panel 10 of FIG. 2 with the movable panel 18 moved by the servo-mechanism 30 to the left to adjust for the seasonal change in the angle of the sun, according to an aspect of the disclosure.
Figures 4, 5:
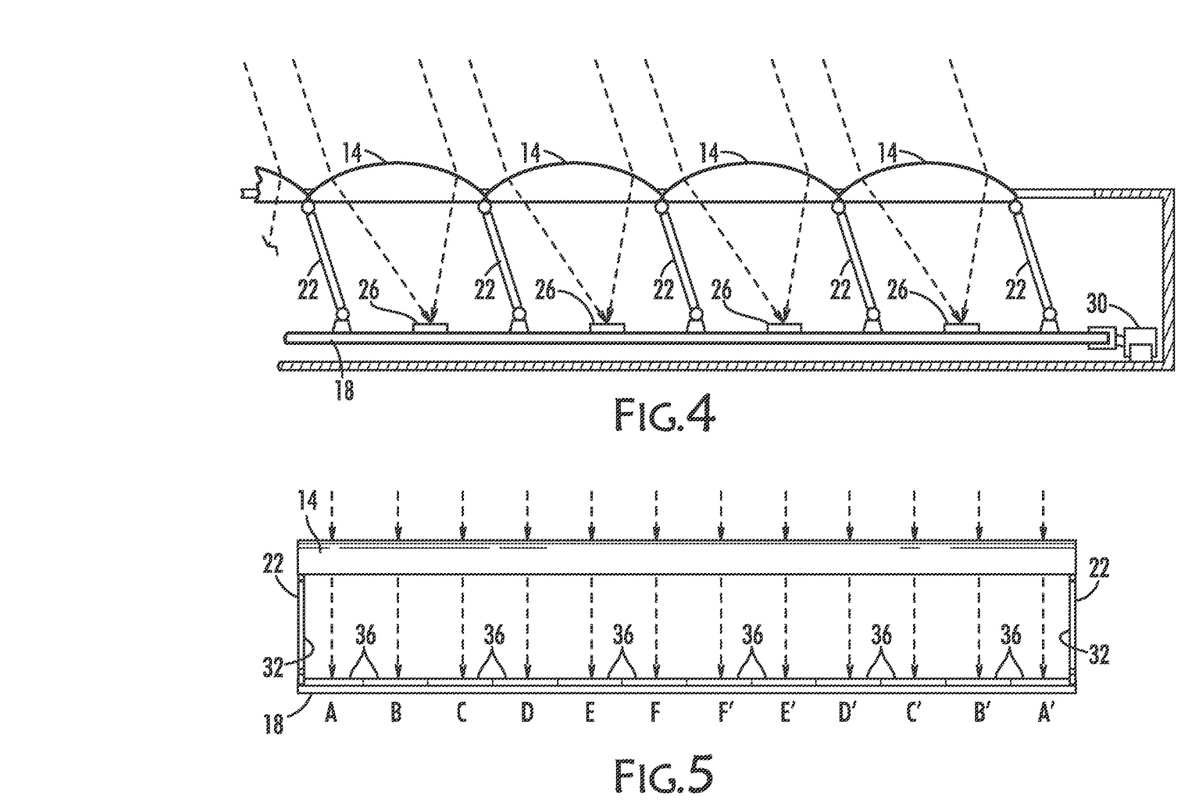
FIG. 4 is an end view of the solar panel 10 of FIG. 2 with movable panel 18 moved to the right to adjust for the angle of the sun, according to an aspect of the disclosure.
FIG. 5 is a side view of the solar panel 10 of FIG. 1 with photovoltaic material 26 divided into pairs of segments 36 that are labeled A-A', B-B', and so forth to F-F', according to an aspect of the disclosure.

This adjustment is illustrated by comparing FIGS. 2, 3, and 4. These figures show end views of solar panel 10. FIG. 2 shows solar panel 10 with the sun's rays, represented by dashed lines, coming from directly overhead. FIG. 3 illustrates the shift in position of movable panel 18 to the left which may be appropriate in winter months in northern latitudes if, in FIG. 3, the south direction is to the right and north direction is to the left, when the sun will generally be traveling southeast to southwest. Likewise, FIG. 4 would then illustrate the adjustment of movable panel 18 to accommodate a more northerly oriented sun path—generally east to west and tilted northerly as it would be in the southern hemisphere in winter or in the northern hemisphere in summer. The movement of movable panel 18 and flexing of flexible supports 22 enables solar panel 10 to focus the sun's light on photovoltaic material 26.

Figure 6:
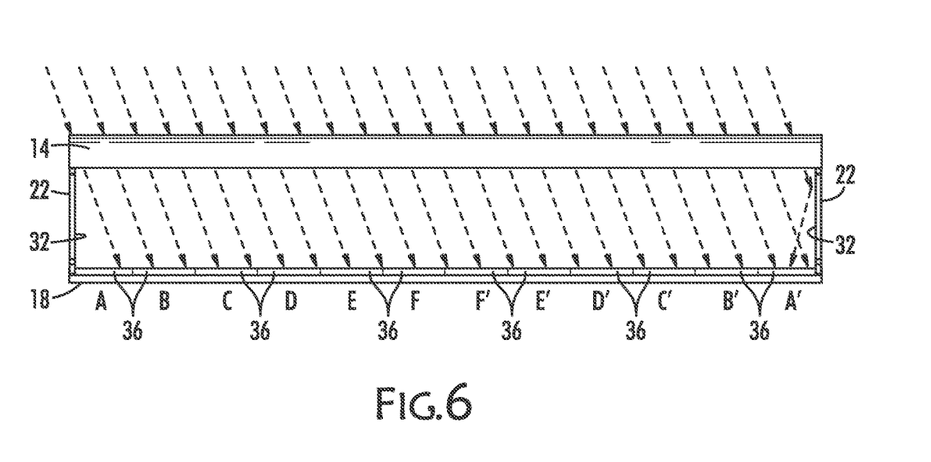
FIG. 6 is a side view of the solar panel 10 of FIG. 5 showing the sunlight coming from a low angle such as during the early morning or late afternoon, and being reflected by mirrored surface of end wall 32 of the movable panel 18 onto segment A' of photovoltaic material 26.

FIGS. 5 and 6 illustrate side views of the solar panel 10. From the side, the sun, in its daily traverse, would move from right to left (assuming that the right sides of FIGS. 5 and 6 are oriented to the east and the left sides are oriented west). When the sun is generally overhead, as illustrated in FIG. 5, sunlight (again represented by dashed lines) falling on solar panel 10 passes through lens 14 and falls directly onto photovoltaic material 26. As the sun traverses the sky during the day, as illustrated in FIG. 6, some sunlight will fall beyond end walls 32 of solar panel 10 and thus shadow movable panel 18 or may fall on end walls 32. In order to include that sunlight, end walls 32 have mirrored interior surfaces to reflect the focused sunlight back onto material 26 so that the reflected light, too, can be converted to electricity and add to the rest of the electrical energy produced.

Photovoltaic material 26 may be divided into segments 36 that may be equal in length. Segments 36 are paired as shown in FIGS. 5 and 6 and identified by letter. A first pair of segments 36 is formed from the outermost two segments 36, segments A and A' in FIGS. 5 and 6, and then the next two outermost segments 36, B-B', are paired, and so forth:

C-C', D-D', etc., until the last two segments 36, in this example, F-F' are paired. Segments 36 in each pair A-A', B-B', C-C', D-D', E-E', and F-F' are wired electrically in parallel and segment pairs A-A', B-B', C-C', D-D', E-E', and F-F' are wired electrically in series to provide the current output for photovoltaic material 26. In this way, sunlight reflected by mirror 34 falling on segment A' adds to any sunlight falling directly on it and makes up in part for the reduced sunlight falling on shadowed segment A. Accordingly, the quantity of electricity produced by all of the segments 36 of photovoltaic material 26 is relatively more constant during a day.

FIGS. 7-12 illustrate how the focal point of light from lens 14 is kept on photovoltaic material 26. Below lens 14 of array 16, photovoltaic material 26 is replaced by a detector 38. Movement of the light focused by lens 14 on detector 38 is used to determine how to move movable panel 18. As the focal point on detector 38 moves in response to the movement of the sun overhead, detector 38 senses that movement and sends a corresponding signal to servo-mechanism 30 which responds by moving movable panel 18 to re-center the focal point of the light on detector 38. Detector 38 may be any type of optical implementation, such as a quad cell, a position dependent detector, a linear array, or a two-dimensional array.

Figure 7:
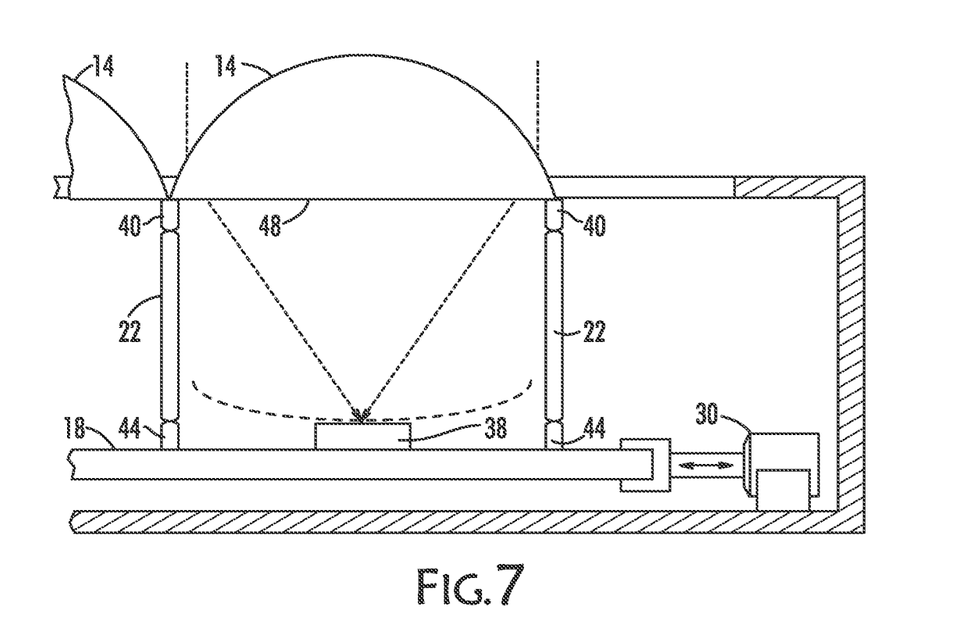
FIGS. 7 and 8 are end views of solar panel 10 of FIG. 1 showing the connection between the servo-mechanism 30 and the movable panel 18 that enables the position of the detector 38 to be adjusted in response to the movement of the focal point of the sunlight through the lens 14 and the flexing of the flexible supports 22 in response to that movement.

In FIG. 7, the movement of detector 38 is accomplished with a servo-mechanism 30 pushing or pulling movable panel 18. Flexible supports 22 facilitate movement of movable panel 18 with respect to lens 14. Flexible supports 22 have two flexible joints, namely, an upper flexible joint 40 and a lower flexible joint 44 that enable it to maintain movable panel 18 parallel to lens 14 despite the movement of movable panel 18 by servo-mechanism 30. The bottom 48 of lens 14 defines a plane parallel to the plane of movable panel 18. When movable panel 18 is pushed as indicated by the arrow in FIG. 8 by servo-mechanism 30, upper and lower flexible joints 40, 44, assure that the bottom 48 of lens remains parallel to movable plane 18. By being able to move lens 14 laterally, the relatively higher or lower angle of the sun throughout the year can be accommodated. There is a slight increase in spacing between of lens 14 and movable panel 18 as movement of movable panel 18 proceeds from its extreme positions to its center position, which affects focus.

Figure 8:
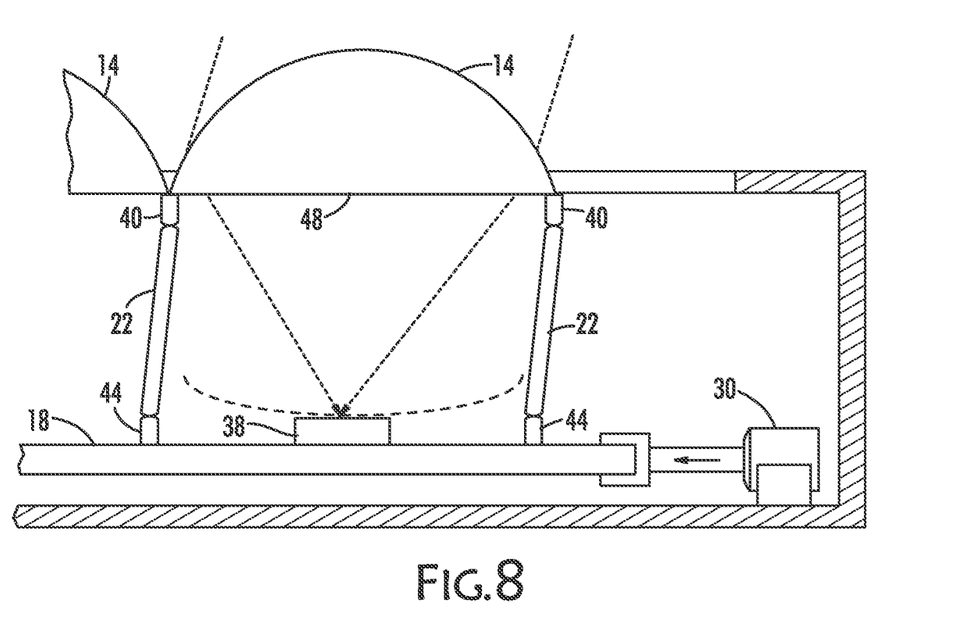
Figure 9:
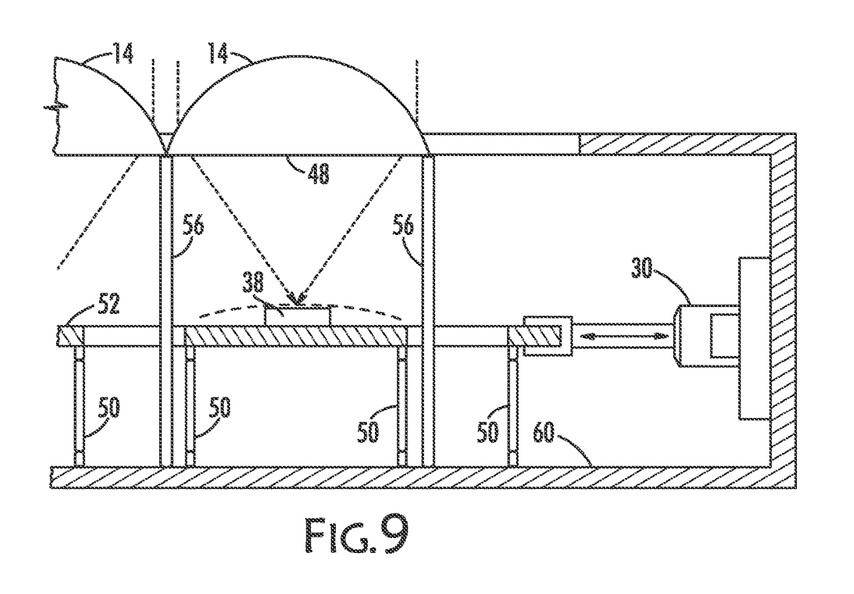
FIGS. 9 and 10 are end views of an alternative arrangement in which the lens 14 is supported from a fixed base 60 by fixed supports 56, and the movable panel 52 is supported from below by fixed base 60 via flexible supports 50 and is movable by the servo mechanism 30 to maintain the focus of sunlight from lens 14 on detector 38.
Figure 10:
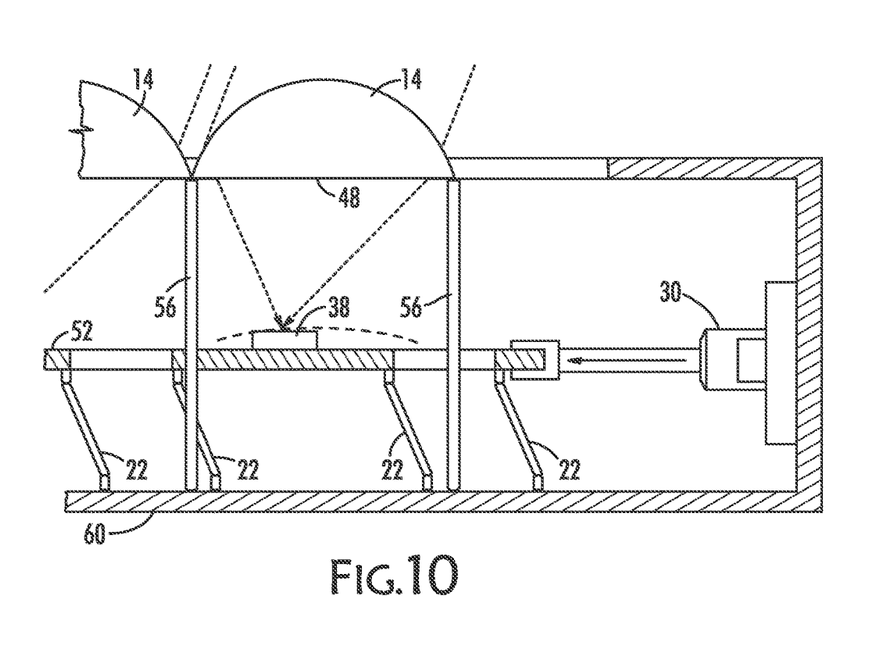

FIGS. 9 and 10 illustrate an inverted flexure arrangement that is an alternative to the arrangement of FIGS. 7 and 8, wherein flexible supports 50 support a movable panel 52 from a fixed base 60 below. A set of rigid supports 56 from fixed base 60 support lens 14. In this arrangement, movable panel 52 may be moved, as shown by the arrow from servo-mechanism 30, to maintain detector 38 at the focal point of lens 14. Unlike the arrangement in FIGS. 7 and 8, the distance between detector 38 and lens 14 rises as movable panel 52 moves from either of its two extreme positions to its central position, and which movement also has an impact on focus.

Figure 11:
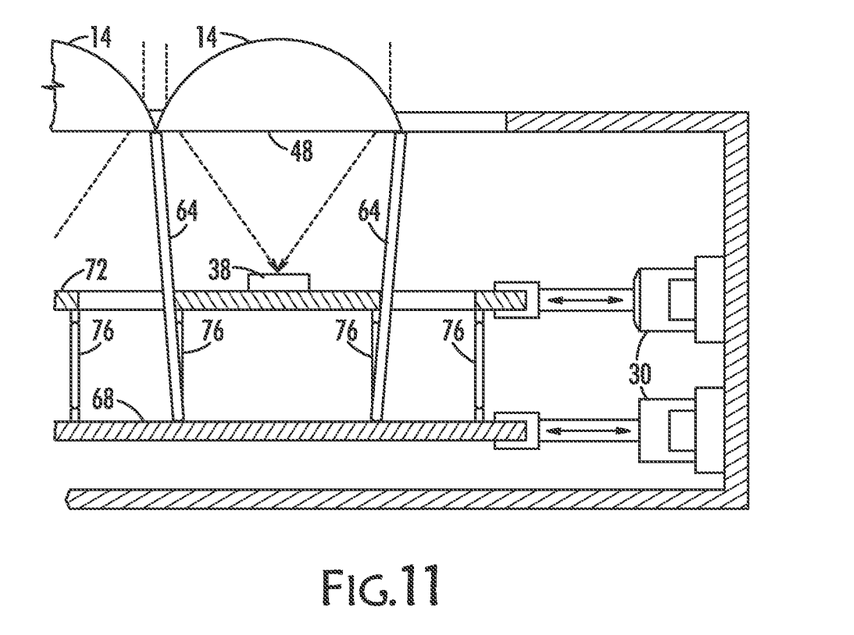
FIGS. 11 and 12 are end views of another alternative arrangement in which the movable panel 72 is supported from below by a movable base 68, and movable panel 72 and movable base 68 are moved by servo mechanisms 30 to keep detector 38 at a fixed distance from the bottom 48 of the lens 14.
Figure 12:
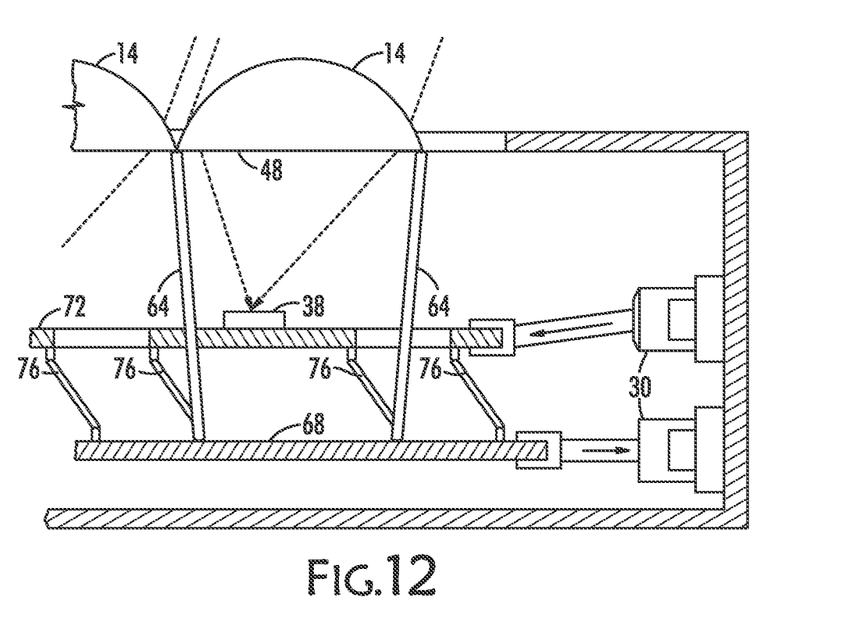

FIGS. 11 and 12 illustrate a third arrangement in which lens 14 is supported by rigid supports 64 which are attached to a movable base 68. Movable base 68 supports a movable panel 72 using flexible supports 76. Movable base 68 and movable panel 72 may be moved independently, as indicated by arrows using, for example, two servo-mechanisms 30. This arrangement preserves the separation distance between the bottom 48 of lens 14 and detector 38, as well as their parallel relationship, for sharp focus while allowing detector 38 to move laterally with respect to lens 14 in tracking the movement of the sun.

In the three aspects of the invention shown in FIGS. 7-12, the relative positions of detector 38 and lens 14 need to be adjusted to keep lens 14 aligned with detector 38 throughout array 16. Detector 38 detects the shifting position of the light focus and signals servo-mechanism 30 to make that change by moving movable panels 18, 52, 72. The rest of array 16, with photovoltaic materials 26 instead of detector 38, follows accordingly.

When introducing elements of the present disclosure or exemplary aspects or embodiment(s) thereof, the articles "a," "an," "the" and "said" are intended to mean that there are one or more of the elements. The terms "comprising," "including" and "having" are intended to be inclusive and mean that there may be additional elements to those listed. Although this disclosure has been described with respect to specific embodiments, the details of these embodiments are not to be construed as limitations.

What is claimed is:

1. A solar panel, comprising:
   a plurality of lenses, a lens of said plurality of lenses being curved to focus light;
   a movable panel;
   photovoltaic material carried on said movable panel, said photovoltaic material generating electric current when light is focused on said photovoltaic materials by said plurality of lenses;
   wherein the photovoltaic material is divided into a plurality of segments disposed in a linear series, the linear series having a long side and a short side, the plurality of segments of the linear series comprising a first segment defining a first longitudinal end of the linear series and a second segment defining a second longitudinal end of the linear series, the second longitudinal end opposite the first longitudinal end; wherein the plurality of segments in the linear series are abuttingly arranged so that each segment physically abuts, along a longitudinal axis parallel to the long side, at least one neighboring segment of the linear series;
   a plurality of supports connecting said plurality of lenses to said movable panel; and
   a servo-mechanism connected to said movable panel, said servo-mechanism moving said movable panel to maintain said light from said plurality of lenses on said photovoltaic material;
   a first mirror located proximate said first segment and disposed perpendicular to the longitudinal axis of the linear series to reflect said light onto said first segment.

2. The solar panel of claim 1, wherein a support of said plurality of supports has flexible joints.

3. The solar panel of claim 2, wherein said support has an upper and a lower flexible joint.

4. The solar panel of claim 1, wherein said light is sunlight from the sun, and wherein said solar panel further comprises a detector on said movable panel, said detector being responsive to movement of a focal point with respect to said detector, said detector providing position information related to said movement of said focal point, and wherein said servo-mechanism is in communication with said detector, said servo-mechanism moving said movable panel to maintain said focal point on said detector.

5. The solar panel of claim 1, wherein said lens is a spherical lens.

6. The solar panel of claim 1, wherein said lens is a cylindrical lens.

7. The solar panel of claim 1, wherein said lens is a Fresnel lens.

8. The solar panel of claim 1, wherein said lens is made of optical plastic.

9. The solar panel of claim 1, wherein said plurality of segments is arranged in segment pairs and electricity generated by said segment pairs is combined in series.

10. The solar panel of claim 1, further comprising a second mirror located proximate said second segment and disposed perpendicular to the longitudinal axis of the linear series to reflect light onto said second segment.

11. A solar panel, comprising:
a plurality of lenses;
a movable panel mounted so as to be movable relative to the plurality of lenses;
a plurality of supports movably connecting the movable panel to the plurality of lenses;
a first set of solar cells carried by the movable panel; the first set comprising first, second, third, fourth, fifth, and sixth solar cells; the first set of solar cells configured to generate electric current when light is focused on the first set of solar cells by the plurality of lenses;
wherein the solar cells of the first set are physically disposed in a first linear series in a sequence of the first solar cell, the third solar cell, the fifth solar cell, the sixth solar cell, the fourth solar cell, the second solar cell; wherein the first solar cell defines a longitudinally first end of the first linear series; wherein the second solar cell defines a longitudinally second end of the first linear series, wherein the second end is opposite the first end;
a second set of solar cells carried by the movable panel, the second set of solar cells physically disposed in a second linear series; the second linear series disposed in spaced relation to the first linear series;
a photodetector carried by the movable panel;
a servo-mechanism connected to the movable panel and configured to move the movable panel to maintain the light from the plurality of lenses on the first set of solar cells based on alignment data from the photodetector;
a first mirror disposed transverse to a longitudinal axis of the first linear series so as to reflect light onto the first solar cell; wherein the first mirror is disposed closer to the first solar cell than to the second solar cell;
wherein the solar cells of the first linear series are grouped in pairs, wherein there are at least three pairs; wherein the solar cells of the first set are electrically connected together such that:
intra-pair connections are in parallel;
inter-pair connections are in series;
wherein the first solar cell and the second solar cell are paired in a first pair;
wherein a second pair comprises the third and fourth solar cells and is disposed between the first and second solar cells;
wherein a third pair comprises the fifth and sixth solar cells and is disposed between the third and fourth solar cells.

12. The solar panel of claim 11, further comprising a second mirror disposed transverse to the longitudinal axis of the first linear series so as to reflect light onto the second solar cell; wherein the second mirror is disposed closer to the second solar cell than to the first solar cell.

13. The solar panel of claim 11, wherein the third solar cell is disposed adjacent the first solar cell; wherein the fourth solar cell is disposed adjacent the second solar cell; wherein the third and fourth solar cells are paired and electrically connected in parallel.

14. The solar panel of claim 11 wherein the first linear series further comprises a seventh solar cell and an eighth solar cell; wherein a fourth pair comprises the seventh and eighth solar cell and is disposed between the fifth and sixth solar cells.

15. The solar panel of claim 14, wherein the first linear series further comprises an ninth solar cell and a tenth solar cell; wherein a fifth pair comprises the ninth and tenth solar cell and is disposed between the seventh and eighth solar cells; wherein the ninth and tenth solar cells physically abut each other.

* * * * *